(12) United States Patent
Kelly et al.

(10) Patent No.: US 9,390,773 B2
(45) Date of Patent: Jul. 12, 2016

(54) SHIFTABLE MEMORY

(75) Inventors: Terence P. Kelly, Palo Alto, CA (US);
Alan L. Davis, Coalville, UT (US);
Matthew D. Pickett, San Francisco, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/126,732

(22) PCT Filed: Jun. 28, 2011

(86) PCT No.: PCT/US2011/042223
§ 371 (c)(1),
(2), (4) Date: Dec. 16, 2013

(87) PCT Pub. No.: WO2013/002772
PCT Pub. Date: Jan. 3, 2013

(65) Prior Publication Data
US 2014/0126309 A1 May 8, 2014

(51) Int. Cl.
| G11C 7/00 | (2006.01) |
| G11C 7/10 | (2006.01) |
| G11C 19/28 | (2006.01) |
| G11C 8/04 | (2006.01) |
| G11C 8/10 | (2006.01) |
| G11C 8/12 | (2006.01) |

(52) U.S. Cl.
CPC .............. *G11C 7/1006* (2013.01); *G11C 8/04* (2013.01); *G11C 8/10* (2013.01); *G11C 8/12* (2013.01); *G11C 19/28* (2013.01); *G11C 19/287* (2013.01)

(58) Field of Classification Search
CPC .................................... G11C 7/22; G11C 7/10

USPC ........................................ 365/189.12, 189.05
See application file for complete search history.

(56) References Cited

U.S. PATENT DOCUMENTS

| 3,593,310 A | 7/1971 | Kievit |
| 3,670,313 A | 6/1972 | Beausoleil et al. |
| 3,708,690 A | 1/1973 | Paivinen |
| 3,760,382 A | 9/1973 | Itoh |

(Continued)

FOREIGN PATENT DOCUMENTS

| CN | 1762027 A | 4/2006 |
| CN | 101162471 A | 4/2008 |

(Continued)

OTHER PUBLICATIONS

PCT Search Report/Written Opinion~Application No. PCT/US2011/042223 dated Jan. 2, 2012~8 pages.

(Continued)

*Primary Examiner* — Michael Tran
(74) *Attorney, Agent, or Firm* — North Shore Associates

(57) ABSTRACT

A shiftable memory is employed in a system and a method to shift a contiguous subset of stored data within the shiftable memory. The shiftable memory includes a memory having built-in shifting capability to shift a contiguous subset of data stored by the memory from a first location to a second location within the memory. The contiguous subset has a size that is smaller than a total size of the memory. The system further includes a processor to provide an address and the length of the contiguous subset. The method includes selecting the contiguous subset of data and shifting the selected contiguous subset.

20 Claims, 6 Drawing Sheets

(56) References Cited

U.S. PATENT DOCUMENTS

| | | | |
|---|---|---|---|
| 3,797,002 A | 3/1974 | Brown | |
| 3,812,336 A * | 5/1974 | Bossen et al. | 714/702 |
| 3,838,396 A | 9/1974 | Martin | |
| 3,893,088 A | 7/1975 | Bell | |
| 3,916,388 A | 10/1975 | Shimp | |
| 4,037,205 A | 7/1977 | Edelberg et al. | |
| 4,133,043 A | 1/1979 | Hiroshima et al. | |
| 4,322,365 A | 3/1982 | Merger | |
| 4,322,635 A | 3/1982 | Redwine | |
| 4,504,925 A | 3/1985 | Gilhousen | |
| 4,521,874 A | 6/1985 | Rau et al. | |
| 4,532,606 A | 7/1985 | Phelps | |
| 4,845,670 A | 7/1989 | Nishimoto et al. | |
| 4,864,544 A | 9/1989 | Spak et al. | |
| 4,903,240 A * | 2/1990 | Von Flue | 365/189.02 |
| 5,050,067 A | 9/1991 | McLagan | |
| 5,153,846 A | 10/1992 | Rao | |
| 5,299,156 A | 3/1994 | Jiang et al. | |
| 5,313,433 A | 5/1994 | Waller | |
| 5,504,919 A | 4/1996 | Lee et al. | |
| 5,543,748 A | 8/1996 | Ando | |
| 5,612,964 A | 3/1997 | Haraszti | |
| 5,677,864 A | 10/1997 | Chung | |
| 5,698,997 A | 12/1997 | Williamson et al. | |
| 5,860,104 A | 1/1999 | Witt et al. | |
| 5,930,323 A | 7/1999 | Tang et al. | |
| 6,021,075 A | 2/2000 | Ueno | |
| 6,061,417 A | 5/2000 | Kelem | |
| 6,166,748 A | 12/2000 | Van Hook | |
| 6,239,638 B1 | 5/2001 | Masuda | |
| 6,327,175 B1 | 12/2001 | Manapat et al. | |
| 6,362,660 B1 | 3/2002 | Deng | |
| 6,411,230 B1 | 6/2002 | Tauchen | |
| 6,493,794 B1 | 12/2002 | Yamashita | |
| 6,526,505 B1 * | 2/2003 | Epstein | 713/150 |
| 6,560,696 B1 | 5/2003 | Hummel | |
| 6,678,806 B1 | 1/2004 | Redford | |
| 6,725,347 B2 | 4/2004 | Yang | |
| 6,745,216 B1 | 6/2004 | Nakamura | |
| 6,765,832 B1 | 7/2004 | Ohtani | |
| 6,820,186 B2 | 11/2004 | Webber et al. | |
| 6,834,005 B1 | 12/2004 | Parkin | |
| 7,027,338 B2 | 4/2006 | Lee | |
| 7,051,153 B1 | 5/2006 | Lin et al. | |
| 7,093,084 B1 | 8/2006 | Leblanc | |
| 7,228,391 B2 | 6/2007 | Silvera et al. | |
| 7,293,132 B2 | 11/2007 | Hurley | |
| 7,308,553 B2 | 12/2007 | Liang | |
| 7,463,056 B1 | 12/2008 | Anderson | |
| 7,502,896 B2 | 3/2009 | Isani et al. | |
| 7,508,701 B1 | 3/2009 | Liang et al. | |
| 7,570,611 B2 | 8/2009 | Stone | |
| 7,573,310 B2 | 8/2009 | Yang et al. | |
| 7,608,849 B2 | 10/2009 | Ino et al. | |
| 7,653,895 B1 | 1/2010 | James-Roxby et al. | |
| 7,728,327 B2 | 6/2010 | Kim et al. | |
| 7,791,376 B2 | 9/2010 | Lim et al. | |
| 7,864,560 B2 | 1/2011 | Tran | |
| 7,983,068 B2 | 7/2011 | Ufert | |
| 8,510,503 B2 | 8/2013 | Yagihashi | |
| 8,717,831 B2 | 5/2014 | Hadley | |
| 8,972,630 B1 | 3/2015 | Stark | |
| 2002/0089024 A1 | 7/2002 | Iwata | |
| 2002/0138715 A1 | 9/2002 | Minematsu | |
| 2002/0194401 A1 | 12/2002 | Sakugawa | |
| 2003/0147488 A1 | 8/2003 | Nakamura | |
| 2004/0019715 A1 | 1/2004 | Apfeldorfer | |
| 2004/0027863 A1 | 2/2004 | Lee et al. | |
| 2004/0201010 A1 | 10/2004 | Ugajin | |
| 2004/0205304 A1 | 10/2004 | McKenney | |
| 2004/0239606 A1 * | 12/2004 | Ota | 345/98 |
| 2005/0127524 A1 | 6/2005 | Sakamoto et al. | |
| 2005/0138501 A1 * | 6/2005 | Motika et al. | 714/724 |
| 2005/0163277 A1 | 7/2005 | Georgakos | |
| 2006/0274585 A1 | 12/2006 | Jung | |
| 2007/0080345 A1 | 4/2007 | Joo et al. | |
| 2007/0083571 A1 | 4/2007 | Meller et al. | |
| 2007/0165446 A1 | 7/2007 | Oliva et al. | |
| 2007/0211531 A1 * | 9/2007 | Atti et al. | 365/185.11 |
| 2007/0262408 A1 | 11/2007 | Takagi et al. | |
| 2007/0267627 A1 | 11/2007 | Joo et al. | |
| 2007/0294469 A1 | 12/2007 | Teruyama | |
| 2008/0071748 A1 | 3/2008 | Wroblewski et al. | |
| 2008/0117700 A1 | 5/2008 | Nakamura | |
| 2009/0010043 A1 | 1/2009 | Gonzalez et al. | |
| 2009/0193384 A1 | 7/2009 | Sima et al. | |
| 2009/0294869 A1 | 12/2009 | Chen | |
| 2009/0323445 A1 | 12/2009 | Adams et al. | |
| 2010/0023730 A1 | 1/2010 | Leeland | |
| 2010/0141322 A1 | 6/2010 | Chua-Eoan | |
| 2010/0164972 A1 | 7/2010 | Akerib | |
| 2010/0193824 A1 | 8/2010 | Kim et al. | |
| 2011/0022791 A1 | 1/2011 | Iyer et al. | |
| 2011/0026314 A1 | 2/2011 | Hamouche et al. | |
| 2011/0063893 A1 | 3/2011 | Behera et al. | |
| 2011/0085390 A1 | 4/2011 | Arsovski et al. | |
| 2011/0106742 A1 | 5/2011 | Pino | |
| 2012/0104346 A1 | 5/2012 | Yi et al. | |
| 2012/0138885 A1 | 6/2012 | Wu et al. | |
| 2013/0048950 A1 | 2/2013 | Levy et al. | |
| 2013/0106480 A1 | 5/2013 | Ribeiro et al. | |
| 2013/0282974 A1 | 10/2013 | Joisha | |
| 2014/0126309 A1 | 5/2014 | Kelly | |
| 2014/0297985 A1 | 10/2014 | Graefe | |
| 2014/0304467 A1 | 10/2014 | Pickett | |
| 2014/0310453 A1 | 10/2014 | Golab | |
| 2014/0379977 A1 | 12/2014 | Perner | |
| 2015/0006809 A1 | 1/2015 | Harizopoulos | |
| 2015/0046644 A1 | 2/2015 | Karp | |

FOREIGN PATENT DOCUMENTS

| | | |
|---|---|---|
| CN | 101336447 | 12/2008 |
| CN | 101594319 A | 12/2009 |
| CN | 101673804 | 3/2010 |
| EP | 0237337 A2 | 9/1987 |
| EP | 0827156 | 4/1998 |
| EP | 1617482 A2 | 1/2006 |
| GB | 2390179 | 12/2003 |
| JP | 63231798 | 9/1988 |
| JP | 5066921 | 9/1993 |
| JP | 2005071500 | 3/2005 |
| KR | 1020060006195 | 1/2006 |
| WO | WO-9314459 | 7/1993 |

OTHER PUBLICATIONS

Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549.

Chudnovskiy, F. et al., "Switching Device Based on First-order Metalinsulator Transition Induced by External Electric Field," IEEE Future Trends in Microelectronics: the Nano Millennium, Wiley Interscience, 2002, pp. 148-155.

PCT Search Report, PCT/U2011/058461, May 31, 2012.

Pickett et al., "Coexistence of Memristance and Negative Differential Resistance in a Nanoscale Metal-Oxide-Metal System," IEEE Advanced Materials, 2011, pp. 23, 1730-1733.

Roberto Perez-Andrade et al., "A Versatile Linear Insertion Sorter Based on a FIFO Scheme," IEEE Computer Society Annual Symposium on VLSI, 2008, pp. 357-362.

Bender et al., Insertion Sort is O (n log n), In Proceedings of the Third International Conference on FunWith Algorithms (FUN), 2004 (6 pages).

European Patent Office, Extended EP Search Report, Application No: 11868835.7-1805 dated Feb. 3, 2015 (8 pages).

Han et al., Integer Sorting in (n √loglog n) Expected Time and Linear Space, 2002 (10 pages).

IEEE P1003.1, Draft 6, Apr. 2001/Open Group Technical Standard, Issue 6, Draft Standard for Information Technology—Portable Operating System Interface (POSIX) (23 pages).

(56) References Cited

OTHER PUBLICATIONS

Mikkel Thorup, Chapter 1—On RAM priority queues, 1996 (9 pages).

Stephen C. Johnson, Algorithms for the 21st century presented at the 2006 USENIX Annual Technical Conference, Boston, MA, vol. 31, No. 5 (7 pages).

Athanassoulis et al., MASM: Efficient Online Updates in Data Warehouses, ACM Special Interest Group on Management of Data Conference, Jun. 2011. 12 pages.

Boriskov, P.P. et al., Metal-insulator Transition in Electric Field: a Viewpoint from the Switching Effect, (Research Paper), Feb. 28, 2006, 18 Pages.

Chen, F el al., S-shaped Negative Differential Resistance Modeling in Electra-thermal Simulation of Phase-change Memory Programming, (Research Paper), Non-Volatile Memory Technology Symposium, Nov. 10-13, 2007, pp. 67-70.

Chijonovskii, F.A. et al., Switching Phenomena in Chromium-doped Vanadium Sesguioxide, (Research Paper), Journal of Applied Physics, Sep. 1, 1998, Pp. 2643-2645, vol. 84, No. 5.

Graefe, G., "B-tree Indexes, Interpolation Search,and Skew," IEEE Proceedings of the Second International Workshop on Data Management on New Hardware (DaMoN 2006), Jun. 25, 2006, Chicago, IL (10 pages).

Hikita, Y. et al., Negative Differential Resistance Induced by Mn Substitution at $SrRuO_3/Nb:SrTiO_3$ Schottky Interfaces, (Research Paper), Journals of American Physical Society, Mar. 19, 2008, vol. 77, No. 20., 14 Pages.

International Searching Authority, The International Search Report and the Written Opinion, Feb. 9, 2012, 8 Pages.

International Searching Authority, The International Search Report and the Written Opinion, Feb. 9, 2012, 9 Pages.

International Searching Authority, The International Search Report and the Written Opinion, Nov. 28, 2012, 9 Pages.

International Searching Authority, The International Search Report and the Written Opinion, May 31, 2012, 10 Pages.

Lee et al., "High-Speed Median Filter Designs Using Shiftable Content-Addressable Memory," IEEE Trans. Circuits and Systems for Video Tech.V4, #6, 12/1994,544-549.

Supplementary European Search Report, Mar. 5, 2015, European Patent Application No. 11874593.4, 3 pages.

Youn, D.H. et al., Observation of Abrupt Metallic Transitions in p-Type GaAs Devices and Comparison with Avalanche Breakdown in the InGaAs APD, (Research Paper). Journal of the Korean Physical Society, Jul. 1, 2005, pp. 1-5, vol. 47, No. 1.

U.S. Appl. No. 14/349,678, Non-Final Rejection dated Oct. 14, 2015, pp. 1-25 and attachments.

\* cited by examiner

SHIFTABLE MEMORY

CROSS-REFERENCE TO RELATED APPLICATIONS

This application is a national stage application under 35 U.S.C. §371 of PCT/US2011/042223, filed Jun. 28, 2011.

STATEMENT REGARDING FEDERALLY SPONSORED RESEARCH OR DEVELOPMENT

N/A

BACKGROUND

Modern computers and related processing systems typically include a processor some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to provide operational sequencing and to otherwise control aspects of the general-purpose computer. For example, virtually all CPUs provide functions or operations for reading data from memory, writing data to memory and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g., a monitor), in some examples.

In contrast, the main memory of modem computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM memory subsystems of main memory may possess circuitry for automatic refresh of data stored therein.

However, the historical architectural division of processing in the processor and storage in memory does preset certain problems that are becoming more and more evident as time goes on. In particular, the conventional architectural division that centralizes all processing in the CPU while relegating the main memory to providing storage can and does present problems, especially as an amount of data being processed increases in size. For example, to process or otherwise manipulate a large data set, all of the data must typically be transported back and forth multiple times between the CPU and the memory via the data bus. Even with sophisticated caching and pre-fetching schemes, the data felts can present a significant bottleneck to overall processing performance, for example.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a linear array within a shiftable memory, according to an example of the principles described herein.

FIG. 1B illustrates an example of an upshift of a contiguous subset of data stored in a linear array within a shiftable memory, according to an example of the principles described herein.

Figures 2, 3:
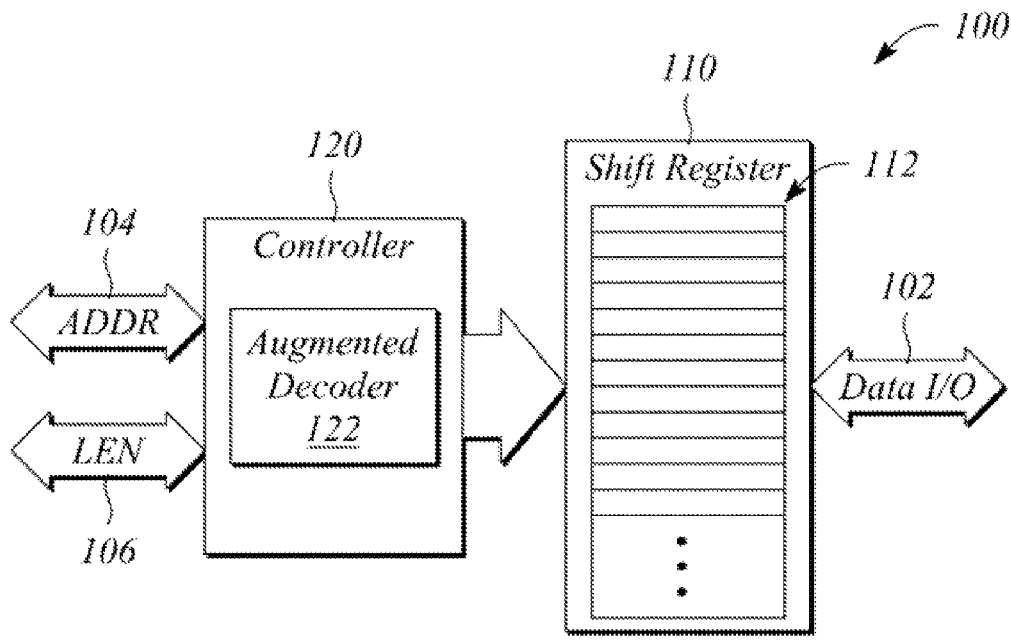
FIG. 2 illustrates a block diagram of a shiftable memory, according to an example of the principles described herein.
FIG. 3 illustrates a truth table of an augmented decoder, according to an example of the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide a data shifting capability in memory. In particular, the data shifting capability is substantially built into the memory, according to various examples of the principles described herein. The built-in data shifting capability provides a lateral translation or shift of a contiguous subset of data stored in the memory. For example, the contiguous subset of stored, data may be shifted within the memory from a first position to a second position. The stored data retains an ordered relationship within the contiguous subset when shifted to the second position. Moreover, the shift takes place entirely within the memory, according to various examples. Specifically, the shift is generally accomplished without using resources such as a processor that are outside of the memory and does not involve data being moved between the processor and the memory. As a result, the memory with built-in shifting capability is referred to as 'shiftable memory' herein.

According to some examples, the shift provided by shiftable memory herein may be employed to 'open' a location in memory into which new data may be inserted. In particular, memory locations either above or below the contiguous subset of stored data may be rendered available for data insertion when the contiguous subset of stored data is moved by the shift within the shiftable memory. According to other examples, the shift may be used to delete or 'overwrite' data stored one of above a beginning of the contiguous subset and below an end of the contiguous subset in particular, the data stored above or below the contiguous subset may be overwritten with a portion of the contiguous subset itself, when the contiguous data is shifted by the shiftable memory. For example, if the contiguous subset of stored data is part of a larger data structure in the shiftable memory, the shift may have the effect of deleting a portion of the data in the larger data or structure. According to some examples, shifting data to either insert data or delete data is the shiftable memory may be accomplished in less time, and in some examples in considerably less time, than is generally possible without using shiftable memory. In fact, the shift may be accomplished to substantially constant time using shiftable memory, according to some examples.

In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each data word in the data being shifted must be read from the conventional memory by the processor and then subsequently written back to the conventional memory, the time to shift the data is generally proportional to the amount or length of the data (e.g., number of data words) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data words involved in the shift must pass between the external resource and the conventional memory through some form of data bus or similar communication channel. The data bus or similar communication channel may substantially limit a speed of the read and write operations and, as a result, an overall speed of the shift. Hence, shifting large subsets of data can become prohibitively expensive in terms of the processing time due to one or both of the effects of data bus speed and the proportional time aspects of performing a shift using conventional memory.

In accordance to the principles described herein, shiftable memory has built-in shifting capability so that data does not have to be read and then written to perform a shift, for example. The contiguous subset of stored data is identified to the shiftable memory (e.g., using an address and a length) and the shiftable memory is instructed to shift the contiguous subset. The shift is then accomplished by and then takes place entirely within the shiftable memory. Speed limitations associated with transferring data to and from an external resource are substantially eliminated by shiftable memory, according to examples of the principles described herein. Moreover, time for shifting may be substantially independent of the length of the contiguous subset, for example.

In particular, shifting within the shiftable memory may be implemented with circuitry of the shiftable memory itself, for example. As such, shifting using shiftable memory does not require sequentially reading and writing each data word of the contiguous subset, according to some examples. For example, shifting using shiftable memory may shift all of the stored data in the contiguous subset in a substantially simultaneous manner. As such, the shiftable memory may implement shifting of the contiguous subset in a time that is substantially independent of the length of the contiguous subset.

In some examples, the shiftable memory may perform the shift in substantially constant time, according to the principles described. By 'constant time' it is meant that a substantially similar amount of time is required to shift the contiguous subset of stored data regardless of a length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the shiftable memory may use more time for longer subsets than relatively shorter subset, the shift is still performed in substantially constant time since the time required is not strictly proportional to the contiguous subset length.

Herein, the term 'memory' refers to any sort of memory that can receive and store data. The memory is generally consistent with memory that may be employed by a computer processor or in a computer system, for example. In particular, by definition herein, memory refers to any sort of memory that can be written to and read from during operation of the computer that employs the memory. For example, the memory may comprise random access memory (RAM). The random access memory may be static RAM (SRAM), for example. Other types of memory include, but are not limited to, dynamic random access memory (DRAM), flash and similar non-volatile memories that are writable during operation of the computer, various forms of optical memory (e.g., rewritable optical discs), magnetic memory (e.g., computer hard drives) and various memory structures based on latches, flip-flop and other bi-stable constructs.

Also herein, a memory may comprise memory cells arranged in arrays. For example, the way may be a linear array. In another example, the memory cells are arranged in a two dimensional (2-D) array. Higher order (e.g., three or more dimensions) arrays also may be employed. In some example, a lower order array (e.g., a linear array) is defined on an array with a larger dimension (e.g., 2-D array). For example, a linear array may be defined by an addressing arrangement on a rectangular 2-D array of memory cells. In addition, arrays may be divided into sub-arrays. For example, a 2-D array may be divided into quadrants as four sub-arrays. According to various examples, the array may be either a physical array or a logical array. A physical array comprises memory cells that are physically organized or located relative to one another according to or as defined by the array. A logical array comprises a logical arrangement of the memory cells as an array. In a logical array, a physical arrangement of the memory cells may differ from the logical arrangement defined by the array, for example. Logical arrays may be defined using address indirection, for example.

A memory cell, also referred to as a 'memory register' or simply a 'register' hereto, is a circuit or related construct that holds or stores data, as defined and employed herein. Further, by definition herein, memory cells or registers may store one or more 'bits' of data that together define a data word. For example, the bit may be a binary value (e.g., '0' or '1') and the memory cell may hold a single bit. In another example, the memory cell or register may hold a plurality of binary value bits. In particular, the memory cell or register may hold or store a complete data word comprising the plurality of bits, as defined herein. For example, a memory cell or register may hold 4, 8, 16, 32 or 64 binary bits that constitute the data word of a particular computer system. In yet another example, the memory cell or register may hold data in another form (e.g., a hexadecimal value, an analog value, etc.). In particular, memory cells and registers, as defined herein, are not restricted to storing data in a binary format but may, in some examples, hold or store an arbitrary data construct. However, for discussion purposes herein, binary data is generally employed throughout by way of example and not by way of limitation, unless otherwise simulated.

Memory cells or registers are also often referred to as 'memory locations' herein. Strictly speaking, a memory location is a memory cell or cells at a location within the memory, the location being designated or identified by an address. The memory cell(s) or memory location is accessed using the address, for example. However, for simplicity of discussion herein, memory cells or memory registers are generally referred to as having or being at an address. Addresses may be associated with a shiftable unit (e.g., a word) of the memory, for example.

As defined herein, a 'shift register' is a plurality of interconnected memory cells that are configured to shift data between adjacent memory cells of the plurality. The shift of the data maybe unidirectional (e.g., one of an upshift or a downshift) or bidirectional (e.g., dynamically selectable between either an upshift or a downshift). Adjacent memory cells may be physically adjacent (i.e., located next to one another) or logically adjacent, by definition herein. Logical adjacency may be established by an overlying logical memory structure (e.g., using indirection), according to some examples. For example, logically adjacent memory cells may be physically separated from one another by an overlying memory structure that employs interleaving. Likewise, the contiguous subset may be physically contiguous (i.e., located in physically adjacent memory cells) or logically contiguous. In particular, the contiguous subset of data as stored in the adjacent memory cells of the shift register acquires a contiguity that is analogous to and dictated by the adjacency of the memory cells (e.g., of the shift register), by definition herein.

In some examples, a shift register may be implemented using flip-flops. For example, a so-called data or 'D' flip-flop may be employed to implement the memory cells of the shift register. However, by definition herein, shift registers are not restricted to implementations using classical flip-flops. For example, SRAM cells may be interconnected with logic circuits to implement a shift register, according to various examples of the principles described herein. In addition, shift registers used in shiftable memory may provide one or both of parallel read and parallel write capability, by definition herein. In particular, a memory cell or memory cells of a shift register may be loaded or programmed with external data through a parallel write to the shift register, according to some examples. A parallel read may be employed to sample data stored in one or more of the memory cells of the shift register, for example.

Further herein and as noted above, a shift as performed by shiftable memory is defined as a lateral translation of a contiguous subset of data stored within the memory, unless otherwise stipulated. In particular, by definition herein, a shift using shiftable memory constitutes the lateral translation (e.g., up or down an array) of the stored, data within the contiguous subset from a first location to a second location within the memory. Furthermore, the shift, when applied to the contiguous subset of stored data, translates all of the stored data within the contiguous subset. Moreover, the shift by shiftable memory does not result in a lateral translation or shift of data outside of the subset of data involved in the shift, by definition herein. In general, the shift may move the data by a distance of one or more memory cells or locations. For example, the shift may move the data a single memory location up or down within the memory.

Herein, the direction 'up' is defined with respect to memory locations within the shiftable memory as a direction toward locations having smaller addresses. The direction 'down' is defined as a direction toward locations having larger addresses. Hence, an 'upshift' is defined as shifting the data to a second location having a smaller address than an address of a first or starting location. Conversely, a 'downshift' results in moving the data from a first location having a smaller address to a second location with a larger address. However, while controllable or selectable according to some examples, the shift direction (e.g., up or down) may be completely arbitrary, as employed herein. Further, the specific use of 'upshift' and 'downshift' herein is for discussion purposes and not by way of limitation.

Figures 1A, 1B:
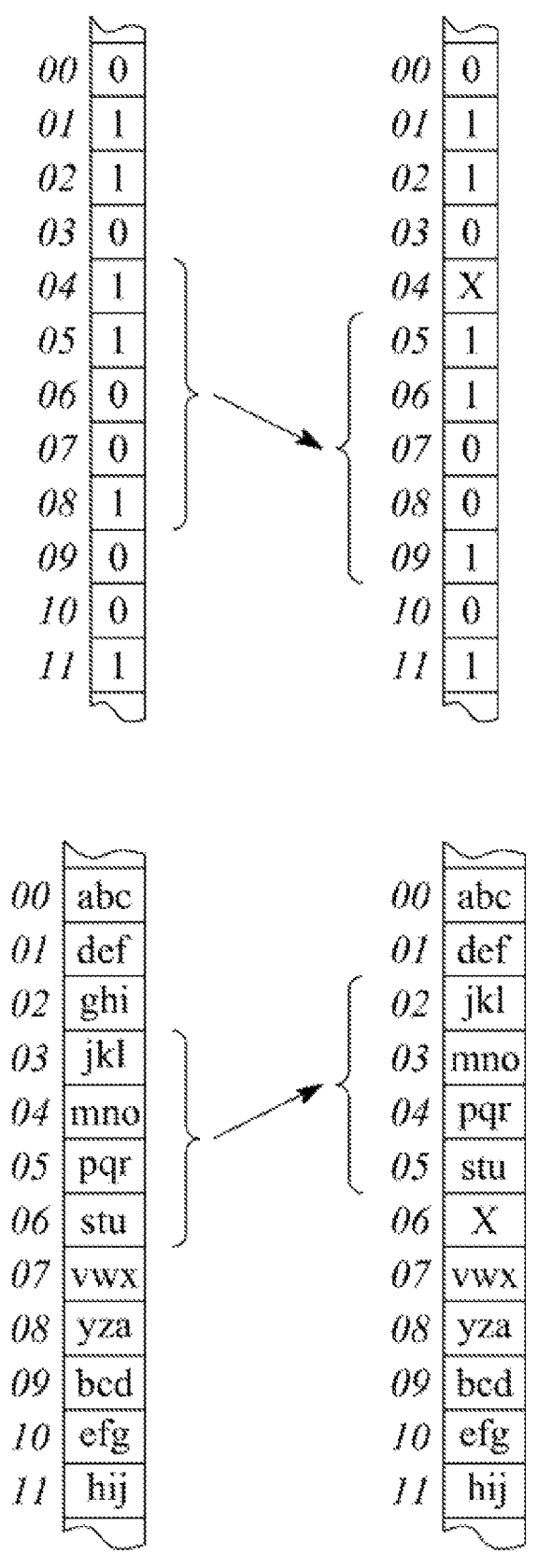

FIG. 1A illustrates an example of a downshift of a contiguous subset of data stored to a linear array within a shiftable memory, according to an example of the principles described herein. In particular, FIG. 1A illustrates a plurality of memory cells each of which is capable of storing a single binary value or bit (e.g., a '1' or '0'). Further as illustrated, each of the illustrated memory cells is identified by an address ranging from 00 to 11. A left side of FIG. 1A illustrates the plurality of memory cells before the downshift while a right side illustrates the same plurality of memory cells after the downshift.

As illustrated, the example downshift within the shiftable memory comprises selecting a contiguous subset of stored data starting with a memory cell at address 04 and ending with a memory cell at address 08, for example. The selected contiguous subset contains bits {11001} in the illustrated example. The shiftable memory then downshifts the selected contiguous subset by moving the stored data in the selected contiguous subset down one address location, as illustrated in the right side of FIG. 1A. The downshift maintains an order of the bits within the contiguous subset and deposits the contiguous subset in memory cells between address 05 and address 09. Downshifting the stored data overwrites the contents of a memory cell immediately below the contiguous subset (i.e., at address 09) and replaces the contents of that memory cell with a last bit (i.e., '1') of the downshifted contiguous subset. Further, the memory cell at address 04 which originally held the first data value of the contiguous subset is rendered indeterminate as indicated by the 'X'. According to various examples, the memory cell at address 04 may retain a copy of the data, value (e.g., '1') that was present before the downshift or may be cleared (e.g., set to '0') after the downshift. In some examples, the memory cell at address 04 may be available for insertion of data from an external source, for example.

FIG. 1B illustrates an example of an upshift of a contiguous subset of data stored to a linear array within a shiftable memory, according to an example of the principles described herein. In particular, FIG. 1B illustrates a plurality of memory cells each of which stores a plurality of data values or data words (e.g., 'abc,' 'def,' etc.). Further as illustrated, each of the illustrated memory cells is identified by an address ranging from 00 to 11. A left side of FIG. 1B illustrates the plurality of memory cells before the upshift while a right side illustrates the same plurality of memory cells after the upshift.

As illustrated in FIG. 1B, the upshift in shiftable memory comprises selecting a contiguous subset of stored data starting with a memory cell at address 03 and ending with a memory cell at address 06, for example. The shiftable memory then upshifts the selected contiguous subset by moving the stored data in the selected contiguous subset up one address location, as illustrated in the right side of FIG. 1B.

The upshift maintains an order of the words within the contiguous subset and deposits the contiguous subset in memory cells between address 02 and address 05. Upshifting the stored data overwrites the contents of a memory cell immediately above the contiguous subset (i.e., at address 02) replacing the contents of that memory cell with a first word (i.e., 'jkl') of the upshifted contiguous subset. Further, the memory cell at address 06 which originally held the last word of the contiguous subset is rendered indeterminate as indicated by the 'X'. According to some examples, the memory cell at address 06 may retain a copy of the data value (e.g., 'stu') that was present before the upshift or may be cleared (e.g., set to '000') after the upshift. In some examples, the memory cell at address 06 may be available for insertion of data from an external source, for example.

According to various examples, the shiftable memory may be a portion of a main memory of a general-purpose computer system. The shiftable memory may represent a subset of the memory that makes up the main memory, for example. Furthermore according to various examples, the shiftable memory is distinct from memory cells, cache and other relatively small memory structures often found integrated together with other components (e.g., an arithmetic logic unit, controller, etc.) in a microprocessor, for example. In particular, shiftable memory by definition herein is part of the main memory and as such, is separate from a processor of a general-purpose computer system or related processing system, according to various examples. In addition, shiftable memory typically contains an order of magnitude or more memory storage than is present or can be present in the processor, according to some examples. For example, shiftable memory may include many megabytes or even gigabytes of memory storage whereas processor memory storage typically may be limited to less than a few tens of bytes (e.g., processor registers) so a few megabytes (e.g., L1 cache, L2 cache etc). According to some examples, the shiftable memory may be a specialized partition of the main memory or a subsystem thereof.

Furthermore, as used herein, the article 'a' is intended to have its ordinary meaning in the patent arts, namely 'one or more'. For example, 'a memory cell' means one or more memory cells and as such, 'the memory cell' means 'the memory cell(s)' herein. Also, any reference herein to 'top', 'bottom', 'upper', 'lower', 'up', 'down', 'front', 'back', 'left' or 'right' is not intended to be limitation herein. Herein, the term 'about' when applied to a value generally means plus or minus 10% unless otherwise expressly specified. Moreover, examples herein are intended to be illustrative only and are presented for discussion purposes and not by way of limitation.

FIG. 2 illustrates a block diagram of a shiftable memory 100, according to an example of the principles described herein. The shiftable memory 100 provides shifting of a contiguous subset of data stored in the shiftable memory 100. Further, shifting of data shifts only the contiguous subset and not other stored data. In particular, when the shiftable memory 100 performs a shift of the contiguous subset, the shift does not shift other stored data located outside of the contiguous subset. Further, the shift moves the contiguous subset of stored data without changing or otherwise affecting an order of the stored data in the contiguous subset, according to some examples. The shift provided by the shiftable memory 100 may be used to one or both of insert new data into the shiftable memory 100 and delete data stored therein, for example.

An external resource (e.g., a processor) communicates data to and from the shiftable memory 100 via a data bus (Data I/O) 102, according to some examples. An address and a length of the contiguous subset may be communicated to the shiftable memory 100 using an address bus (ADDR) 104 and a length bus (LEN) 106, for example. An address bus that carries both the address and the length or alternatively a pair of addresses may be employed in another example (not illustrated).

As illustrated, the shiftable memory 100 comprises a shift register 110. The shift register 110 comprises a plurality of memory cells 112 to store data. In some examples, the memory cells 112 are configured to store binary data. In some examples, each memory cell 112 is configured to store a single bit of binary data (e.g., as a '1' or '0'). In other examples, each memory cell 112 is configured to store a plurality of binary data bits. For example, each memory cell 112 may store a data word. In particular, according to some examples, each memory cell 112 comprises a plurality of memory locations configured as in aggregate to store data bits corresponding to the data word. The plurality of data bits of the data word defines a width of the shift memory cell 112. In other examples, the memory cell 112 may store the data in a form other than as one or more binary bits.

According to various examples, the shift register 110 may be implemented using substantially any memory technology. For example, the memory cells 112 of the shift register 110 may be implemented using static random access memory (SRAM). In another example, one or more flip-flops such as, but not limited to, a D flip-flop, may be employed to implement the memory cells 112. In other examples, yet another memory technology (e.g., DRAM, etc.) may be used to implement the memory cells 112 of the shift register 110.

The shiftable memory 100 illustrated in FIG. 2 further comprises a controller 120. The controller 120 is configured to select a contiguous subset of the stored data. The controller 120 is further configured to shift the selected contiguous subset to a first location to a second location within the shift register 110. The selected contiguous subset, has a length that is less than a total length of the shift register 110, according to various examples of the principles described herein. The controller 120 may shift the selected contiguous subset by instructing the shift register 110 to perform the shift using one or more control signals, for example.

In various examples, the shiftable memory 100 facilitates one or both of an upshift and a downshift of the contiguous subset of stored data. In particular, a memory cell 112 of the second location within the shift register 110 may be located either above of below a corresponding memory cell 112 of the first location, depending on a direction of the shift. In some examples, the memory cell 112 of the second location is a single memory cell (or memory location) away from the corresponding memory cell 112 of the first location. In other words, the shift represents movement of the contiguous subset of stored data by a single memory location or address. In other examples, the second location represents a movement of more than a single memory cell 112. For example, the data words may be stored as a linear array of bits within the shiftable memory and the shift may be a number of bits equal to a length of the data word in bits.

In some examples, the selected contiguous subset is specified by both of an address of a first memory cell 112 of the contiguous subset and an address of a last memory cell 112 in the contiguous subset. For example, the first memory cell address and the last memory cell address are communicated to the controller 120 (e.g., via an address bus) to facilitate selecting the contiguous subset. The first memory cell address and last memory cell address may be communicated either sequentially as a first address followed by a second address over a single bus (e.g., ADDR 104), for example. Alternatively, the first and last addresses may be communicated in parallel as two simultaneous addresses either over two buses or over two portions of a single, wide bus, for example.

In another example, the selected contiguous subset is specified by an address of the first memory cell 112 and a length of the contiguous subset (e.g., via ADDR 104 and LEN 106 as illustrated). In some of these examples, the length may be the length of the contiguous subset that follows the first memory cell 112 such that the last memory cell address is given by a sum of the first memory cell address and the length. In other examples, the length includes the first memory cell 112 such that the last memory cell address is given by the first memory cell address plus the length minus one. Other examples may specify the last memory cell address and the length of the contiguous subset that precedes the last memory cell, as well as other schemes, for example.

In some examples, the controller 120 comprises an augmented decoder 122. The augmented decoder 122 employs information regarding the address and length (or alternatively the first and last memory cell addresses) to select the contiguous subset of stored data. In some examples, the augmented decoder 122 uses the information (e.g., address and length of the contiguous subset) to assert an output corresponding to each of the memory cells 112 of the selected contiguous subset within the shift register 110. Asserting an output may comprise outputting a logic '1' on a connection path or wire (e.g., a word line) between the augmented decoder 122 and the shift register 110, for example. As such, the augmented decoder 122 may output a logic '1' on a plurality of word lines of the shift register 110, the word lines corresponding to the memory cells 112 that contain the stored data of the selected contiguous subset. The word lines may be connected to a load enable (LE) or a select (SEL) input of the memory cells 112, for example. In other examples, asserting an output comprises outputting a logic '0.' Asserting a logic '0' may be used when the memory cells 112 have a 'not' load enable ($\overline{LE}$) or a 'not' select ($\overline{SEL}$) input, for example.

In some examples, the augmented decoder 122 is further configured to assert an additional output corresponding to one of a memory cell 112 adjacent to and immediately above the selected contiguous subset or a memory cell 112 adjacent to and immediately below the selected contiguous subset. For example, the additional output corresponding to the memory cell 112 immediately above the selected contiguous subset may be asserted when the stored data is to be upshifted within the shift register 110. The additional output corresponding to the memory cell 112 immediately below the selected contiguous subset may be asserted when the stored data is to be downshifted within the shift register 110, for example. In particular, the additional output may be used to enable the memory cell 112 that receives stored data from either the first memory cell 112 or the last memory cell 112 of the contiguous subset of data.

FIG. 3 illustrates a truth table of an augmented decoder 122, according to an example of the principles described herein. In particular, the augmented decoder 122 corresponding to the illustrated truth table is configured to select the contiguous subset in an example shift register 110 having eight memory cells 112. The truth table has three address inputs (ADDR), a length (LEN) input and eight word lines W (i.e., $W_0$-$W_7$). The eight word W may correspond to load enable (LE) inputs of eight memory cells 112 in the example shift register 110, for example. As can be seen in the truth table, for a value of LEN equal to '00', the augmented decoder 122 functions substantially similar to a conventional decoder (i.e., only one word line W is asserted at a time). However, a plurality of word lines W are asserted for all other values of LEN facilitating simultaneous enabling of a corresponding plurality of memory cells 112 that hold or store the selected contiguous subset of stored data to be shifted.

In some examples, the augmented decoder 122 may be implemented using a read only memory (ROM). The ROM is programmed with a truth table that specifies the functionality of the augmented decoder 122. A decoder of the ROM decodes an input (e.g., ADDR and LEN) and the programmed connections within the ROM augment the output of the ROM decoder to produce the augmented decoder 122 functionality, for example. In another example, a conventional decoder may be augmented with an output circuit other than the programmed connections to implement the augmented decoder 122.

Figure 4:
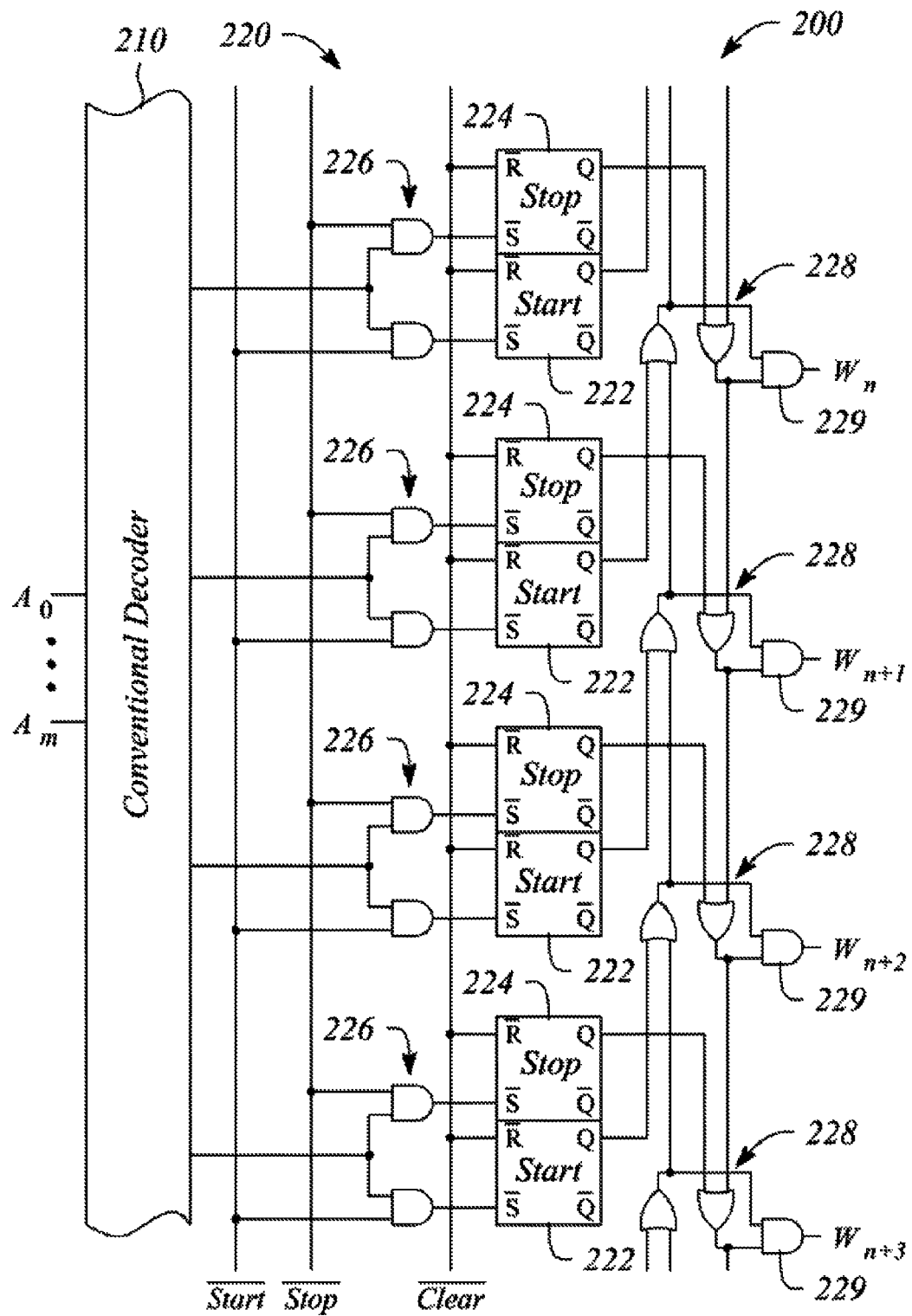
FIG. 4 illustrates a schematic diagram of a portion of an augmented decoder, according to an example of the principles described herein.

FIG. 4 illustrates a schematic diagram of a portion of an augmented decoder 200, according to an example of the principles described herein. The augmented decoder 200 may be used as the augmented decoder 122 of the controller 120 (e.g., illustrated in FIG. 2), for example. In particular, as illustrated in FIG. 4, the augmented decoder 200 comprises a conventional decoder 210 and an output circuit 220. The output circuit 220 implements a ripple cascade. The output circuit 220 comprises a first plurality of latches 222 and a second plurality of latches 224. The latches 222, 224 of the first and second pluralities may be simple set-reset (S-R) latches, for example. The first plurality of latches 222, labeled 'Start' FIG. 4, is used to set a starting point of the ripple cascade at an output of the augmented decoder 200. The starting point corresponds to a first word line W to be asserted. The second plurality of latches 224, labeled 'Stop' in FIG. 4, is used to set a stopping point of the ripple cascade at an output of the augmented decoder 200 corresponding to a last word line to be asserted.

The output circuit 220 further comprises a plurality of AND gates 226 that connect outputs of the conventional decoder 210 to the latches 222, 224. The output circuit 220 further comprises a plurality of OR gates 228 and another plurality of AND gates 229. The plurality of OR gates 228 create the ripple cascade to drive the AND gates 229. The AND gates 229, in turn, drive the asserted word lines W.

The augmented decoder 200 is configured to receive inputs corresponding to a start address and stop addresses of the selected contiguous subset. For example, the augmented decoder 200 may receive an input corresponding to the start address followed at some later time by a second input corresponding to a stop address. The conventional decoder 210 decodes the first input received and asserts an output line corresponding to the start address. The asserted output line sets one of the latches 222 of the first plurality when $\overline{Start}$ is asserted, according to operation of the plurality of AND gates 226. The conventional decoder 210 then decodes the second input received and asserts an output line corresponding to the stop address. The asserted output line sets one of the latches 224 of the second plurality when $\overline{Stop}$ is asserted, according to operation of the plurality of AND gates 226. Hence, asserting $\overline{Start}$ latches (i.e., sets) the starting point of the ripple cascade while asserting $\overline{Stop}$ latches (i.e., sets) the stopping point.

The 'set' or latched latch 222 of the first plurality establishes the ripple cascade starting point by asserting an output Q of that set latch 222. Similarly, the ripple cascade stopping point is established by the 'set' or latched latch 224 of the second plurality asserting an output Q of that set latch 224. The asserted outputs Q of the set latches 222, 224 propagate or 'ripple' up and down the plurality of OR gates 228 between the OR gates 228 corresponding to the two asserted outputs Q of the set latches 222, 224. When the propagation finishes, the AND gates 229 in communication with the corresponding OR gates 228 assert all of the outputs of the augmented decoder 200 between the output corresponding to the start address and the address corresponding to the stop address. A $\overline{\text{Clear}}$ input may be used to reset or clear the set latches 222, 224.

According to some examples, memory cells 112 of the shift register 110 comprise a static random access memory (SRAM) cell and a logic circuit. The logic circuit is configured to select among a plurality of inputs that are to be applied by the logic circuit to a data input of the SRAM cell of a particular memory cell 112. The plurality of inputs include an external data input to be selected by the logic circuit when external data is to be written to and stored by the SRAM cell of a particular memory cell 112, an output of an adjacent SRAM cell immediately below the SRAM cell of the particular memory cell 112 to be selected by the logic circuit when stored data is to be shifted up (i.e., upshifted) within the shift register 110, and an output of another adjacent SRAM cell immediately above the SRAM cell of the particular memory cell 112 to be selected by the logic circuit when stored data is shifted down (i.e., downshifted) within the shift register 110.

Figure 5A:
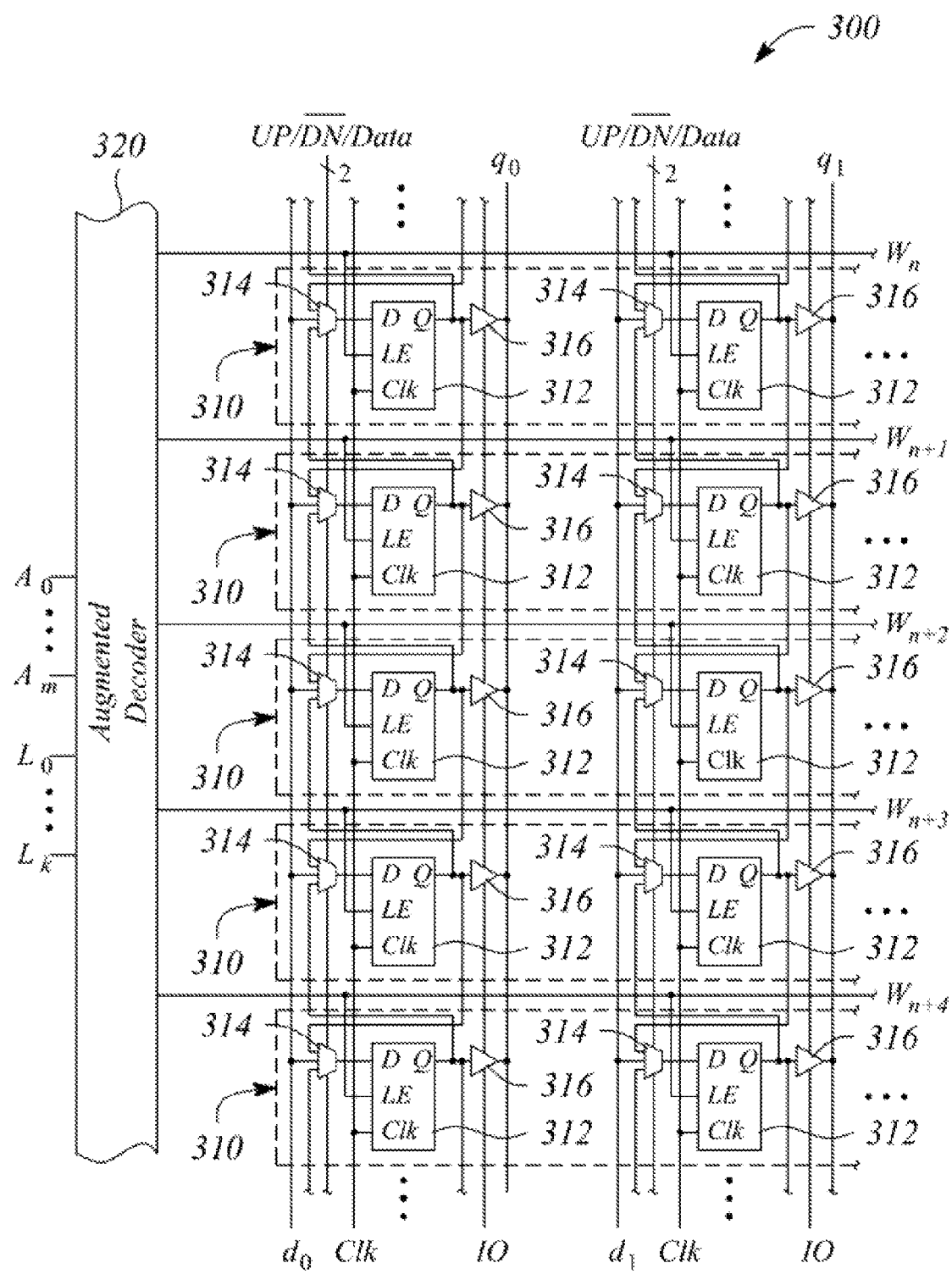
FIG. 5A illustrates a schematic diagram of a shiftable memory, according to an example of the principles described herein.

FIG. 5A illustrates a schematic diagram of a shiftable memory 300, according to an example of the principles described herein. As illustrated, the shiftable memory 300 comprises a plurality of memory cells 310 connected to an augmented decoder 320. The plurality of memory cells 310 are arranged vertically with each memory cell 310 being connected to a different one of a plurality of word lines W (e.g., $W_n$, $W_{n+1}$, etc.) from the augmented decoder 320. Together the memory cells 310 of the plurality form a shift register that is substantially similar to the shift register 110, described above with respect to the shiftable memory 100. According to some examples, the augmented decoder 32, in combination with additional logic (not illustrated), serves as the controller of the shiftable memory 300. The controller may be substantially similar to the controller 120, described above with respect to the shiftable memory 100, according to some examples. In fact, according to some examples, the augmented decoder 320 is substantially similar to the augmented decoder 112. Moreover, the shiftable memory 300 represents an example implementation of the shiftable memory 100 described above.

As illustrated in FIG. 5A, each of the memory cells 310 of the shiftable memory 300 comprises a plurality of SRAM cells 312, logic circuits 314, and tri-state butlers 316. The plurality of SRAM cells 312 in each memory cell 310 may be used together to store a data word comprising a plurality of binary bits, for example. External data is written to the memory cells 310 using data lines d (e.g., $d_0$, $d_1$, etc.). Data stored by the memory cells 310 may be accessed and read using output lines q (e.g., $q_0$, $q_1$, etc.). In souse examples (not illustrated), the data lines and output lines are multiplexed to connect to a common data bus (e.g., Data I/O 102, illustrated in FIG. 2).

The tri-state bullets 316 are connected between an output Q of each of the plurality of SRAM cells 312 and a corresponding output data line q. The tri-state buffers 316 are enabled for reading data by asserting an IO input, as illustrated. When the IO input is not asserted, the outputs Q of the SRAM cells 312 are isolated from the output data lines q. The word line of each memory cell 310 is connected in parallel to a load enable LE of each of the SRAM cells 312 of the memory cells 310. The load enable LE is used to enable loading data into the SRAM cells 312. A clock line Clk of each of the SRAM cells 312 is connected in common to all SRAM cells 312 at a clock input Clk.

Each SRAM cell 312 has an associated logic circuit 314 connected to a data input D of the SRAM cell 312 at an output of the logic circuit 314. The associated logic circuit 314 has three inputs that are connected respectively to each of an external data line d (e.g., $d_0$, $d_1$, etc.) corresponding to the SRAM cell 312, an output Q of a corresponding SRAM cell 312 of the memory cell 310 immediately below the SRAM cell 312, and an output Q of another corresponding SRAM cell 312 of the memory cell 310 immediately above the SRAM cell 312. The logic circuit 314 is configured to select the external data line d when external data is to be written to and stored by the SRAM cell 312. The logic circuit 314 is configured to select the output Q of the corresponding SRAM cell 312 immediately below the SRAM cell 312 when stored data is to be shifted up within the shift register of the shiftable memory 300. The logic circuits 14 is further configured to select the output Q of the corresponding SRAM cell 312 immediately above the SRAM cell 312 when stored data is shifted down within the shift register.

For example, control of the selection by the logic circuit 314 may be provided by a control input UP/$\overline{\text{DN}}$/Data, as illustrated. Specifically, when UP is asserted, stored data within the memory cells 310 of the shiftable memory 300 is upshifted while stored data is downshifted when UP is not asserted (i.e., when $\overline{\text{DN}}$ in asserted). A first memory cell 310 and a range of memory cells 310 that participate in the upshift or downshift is controlled by a combination of the address ($A_0$, . . . , $A_m$) and length ($L_0$, . . . , $L_k$) provided to the augmented decoder 320, for example. Asserting Data places the shiftable memory 300 in a write mode similar to a conventional SRAM allowing external data to be written to a memory cell 310 selected by the word lines W of the augmented decoder 320 based on the input address ($A_0$, . . . , $A_m$) according to some examples.

In some examples, the logic circuit 314 comprises a multiplexer circuit. For example, the multiplexer circuit may be a three-input multiplexer configured to select one of the three inputs defined above for application to the data input D of the SRAM cell 312. In other examples, the logic circuit 314 may comprise plurality of tri-state buffers, one tri-state buffer for each of the three defined inputs of the logic circuit 314. In yet other examples, the logic circuit 314 may comprise a combination of one or more multiplexers (e.g., a two-input multiplexer), one or more tri-state buffers and various other logic gates.

Figure 5B:
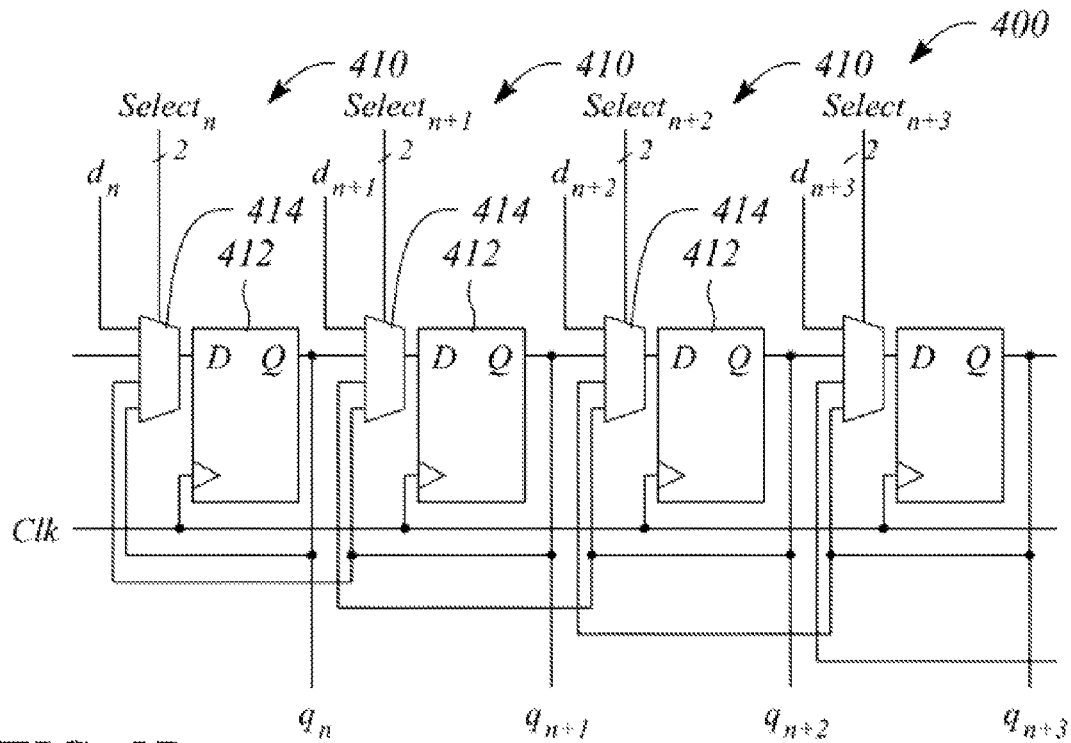
FIG. 5B illustrates a schematic diagram of a shiftable memory, according to another example of the principles described herein.

FIG. 5B illustrates a schematic diagram of a shiftable memory 400, according to another example of the principles described herein. In particular, as illustrated, memory cells 410 of the shiftable memory 400 each comprises a D flip-flop 412 and a multiplexer 414. The multiplexer 414 is configured to select among one of four inputs to be applied to a data input D of the D flip-flop 412. Selection among the four inputs is according to a Select input (e.g., $\text{Select}_n$, $\text{Select}_{n+1}$, $\text{Select}_{n+2}$, etc.). The Select inputs may be provided by a controller (not illustrated), for example. Further, some decoding, for example using tri-state buffers (not illustrated), may be employed with the external data, inputs d (e.g., $d_n$, $d_{n+1}$, $d_{n+2}$, etc.) and data outputs q (e.g., $q_n$, $q_{n+1}$, $q_{n+2}$, etc.) when writing to and reading torn the shiftable memory 400 via a data bus, for example. Note that the external data inputs d and data outputs q illustrated in FIG. 5B do not necessarily correspond to similarly named data inputs and outputs illustrated in FIG. 5A, according to some examples.

Referring again to FIG. 5B, a first of the four selectable inputs of the multiplexer 414 is connected to a respective one of the external data inputs d. The first selectable input is selected when external data is to be written to and stored by the D flip-flop 412. A second of the four selectable inputs is connected to an output Q of an adjacent D flip-flop 412 at an address immediately above the D flip-flop 412 (i.e., illustrated to the left of the D flip-flop 412). The second selectable input is selected by the multiplexer 414 when stored data is to be downshifted. A third of the four selectable inputs is connected to an output of an adjacent D flip-flop 412 at an address immediately below the D flip-flop 411 (i.e., illustrated to the right of the D flip-flop 412). The third selectable input is selected by the multiplexer 414 when stored data is to be upshifted. A fourth of the four selectable inputs is connected to an output of the D flip-flop 410 itself. The fourth selectable input is selected by the multiplexer 414 when stored data is to be held and not shifted by the D flip-flop 412.

Stored data may be held and not shifted when a particular D flip-flop 412 is not one of the memory cells 410 that stores data of the contiguous subset, for example. In particular, the multiplexer 414 may select the fourth selectable input to disable shifting by the D flip-flop 412. The multiplexer 414 may be an actual multiplexer or may be a logic circuit that functions as a multiplexer (e.g., implemented with tri-state buffers, switches, etc.), according to various examples.

The shiftable memory 400 illustrated in FIG. 5B further comprises a controller (not illustrated). The controller may comprise an augmented decoder substantially similar to the augmented decoder 122 described above with respect to the shiftable memory 100. In particular, the controller provides outputs to the Select$_n$ (e.g., to control the multiplexer 414) of individual ones of the memory cells 410 tor participation in an upshift or a downshift. Participation is determined by an address (ADDR) and a length (LEN) of the contiguous subset of stored data to be shifted, for example. Likewise, the controller provides outputs to select the fourth input of the multiplexers 414 of those memory cells 410 that are not participating in the upshift or downshift. The shiftable memory 400 may represent another example implementation of the shiftable memory 100, described above. In particular, FIG. 5B illustrates shiftable memory 400 having a single bit word that stores the single bit words in individual ones of the D flip-flops 412, for example.

Figure 6:
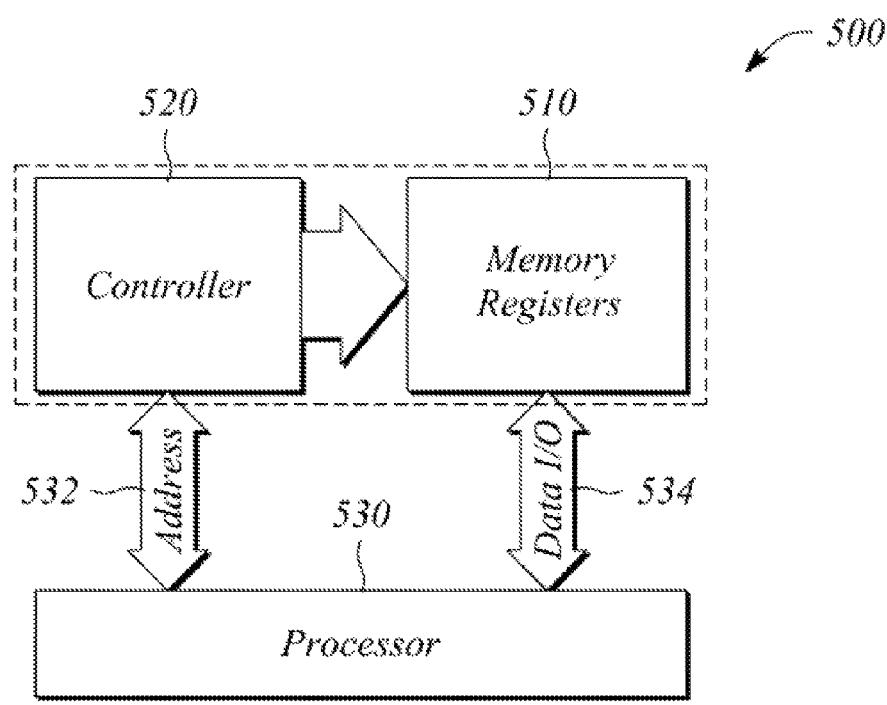
FIG. 6 illustrates a block diagram of a shiftable memory system, according to an example of the principles described herein.

FIG. 6 illustrates a block diagram of a shiftable memory system 500, according to an example of the principles described herein. The shiftable memory system 500 comprises a plurality of memory cells 510 arranged adjacent to one another in an array. Each memory cells 510 is configured to store one or more data bits corresponding to a data word. According to some examples, the cells 510 arranged in the array may be substantially similar to memory cells 112 of the shift register 110 of the shiftable memory 100, described above. In particular, the memory cell 510 may comprise one or more static random access memory (SRAM) Cells arranged to store the data word, for example.

As illustrated in FIG. 6, the shiftable memory system 500 further comprises a controller 520. The controller 520 is configured to select and shift a contiguous subset of data words within the array. The contiguous subset has a length that is less than a total length of the array. The shift represents either of an upshift or a downshift of the selected contiguous subset within the array. The shift of the selected contiguous subset does not result in a shift of other data words located outside of the selected contiguous subset. In some examples, the controller 520 may be substantially similar to the controller 120 described above with respect to the shiftable memory 100.

In particular, the controller 520 may comprise an augmented decoder (not illustrated) to assert a load enable or otherwise select each memory cell 510 from a beginning to an end of the selected contiguous subset of data words, according to some examples. The beginning of the selected contiguous subset may correspond to the address and the end may correspond to a sum of the address and the length received, for example. The controller 520 may further be configured to assert a load enable, word line, or an equivalent corresponding to at least one of a memory cell 510 immediately above the memory cell 510 at the beginning and a memory cell 510 immediately below the memory cell 510 at the end of the contiguous subset depending on a direction of the shift within the array.

The shiftable memory system 500 further comprises a processor 530. The processor 530 is configured to provide the address and the length of the contiguous subset of data words. The processor 530 may communicate with the controller 520 via an address bus (Address) 532. For example, the processor 530 may provide the address and the length directly as an address of a memory cell 510 corresponding to a beginning of the contiguous subset and a length that determines a memory cell 510 corresponding to an end of the contiguous subset. In another example, a first address of the memory cell 510 corresponding to the beginning and a second address corresponding to the end of the contiguous subset may be provided by the processor 530. In this example, the provided length may be inferred from a difference between the first and second addresses. Further, the processor 530 may communicate with the memory cell 510 using a data bus (Data I/O) 534. For example, the data bus 534 may be used by the processor 530 to write data to the memory cell 510. Similarly, data stored by the memory cell 510 may be read by the processor 530 using the data bus 534, for example.

According to some examples, the processor 330 may be a central processor (e.g., a CPU such as a microprocessor) of a general-purpose computer that employs the shiftable memory system 500, for example. However, the plurality of memory cells 510 and the controller 520 are distinct and separate from the processor 530, according to various examples. For example, the plurality of memory cells 510 and the controller 520 may be a specialized part of a memory system (e.g., RAM) that is employed by the processor 530. In particular, the memory cells 510 and the controller 520 are not conventional shift registers of the processor 530, for example. A dashed line in FIG. 6 illustrates the physical separation between the processor 530 and the memory cells 510 and the controller 520.

Figure 7:
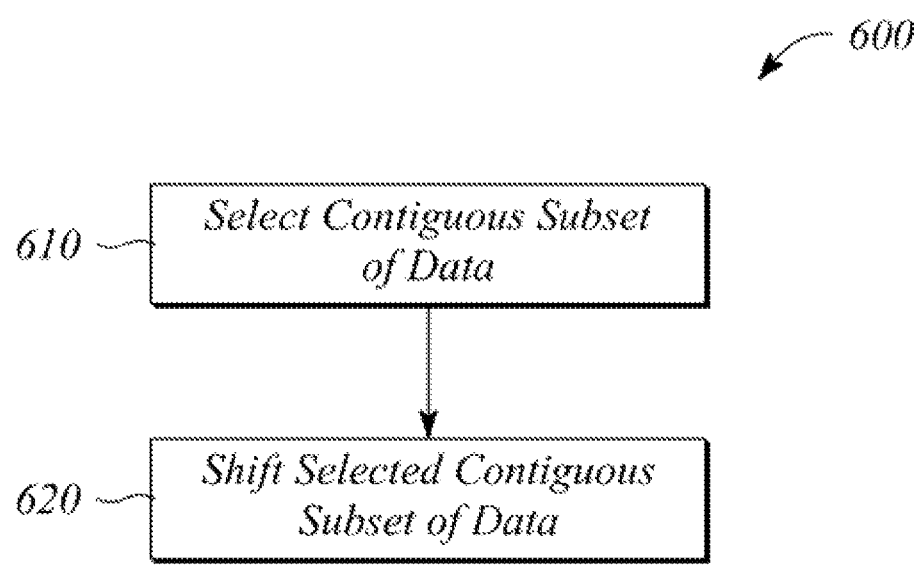
FIG. 7 illustrates rates a flow chart of a method of shiftable memory, according to an example of the principles described herein.

FIG. 7 illustrates a flow chart of a method 600 of shifting data in a shiftable memory, according to an example of the principles described herein. As illustrated, the method 600 of shifting data in a shiftable memory comprises selecting 610 a contiguous subset of data stored in memory cells of a memory having built-in shifting capability. A size or length of the selected 610 contiguous subset of data is less than a total size or length of the memory. In some examples, selecting 620 comprises providing an address and the length of the selected 610 contiguous subset of data. The address designates a memory cell within the memory corresponding to a beginning of the contiguous subset of data, and a sum of the address and the length designates a memory cell within the memory corresponding to an end of contiguous subset of data, for example. In other examples, selecting 610 a contiguous subset of data comprises providing a start address and a stop address. The start address, is the address of the memory cell corresponding to the beginning of the contiguous subset while the stop address is the address of the memory cell corresponding to the end of the contiguous subset, for example.

The method 600 of shifting data in a shiftable memory further comprises shifting 620 the selected contiguous subset of data from a first location to a second location within the memory. However, when me selected contiguous subset is shifted 620, the shifting 620 occurs entirely within the memory. Moreover, shifting 620 the selected contiguous subset does not shift other stored data located outside of the selected contiguous subset.

In some examples, the method 600 of shiftable memory further comprises one of writing data to the memory to provide the stored data and reading data from the memory after shifting 620 the contiguous data subset of data. According to various examples, the method 600 of shifting data in a shiftable memory may be implemented using one or more of the shiftable memory 100 and the shiftable memory system 500 as well as either of the shiftable memory 300 and shiftable memory 400, described above.

Thus, there have been described examples of a shiftable memory, a shiftable memory system and a method of shiftable memory that shift a contiguous subset of stored data within the shiftable memory. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A shiftable memory comprising:
a memory comprising memory cells and a controller to shift a contiguous subset of data stored by the memory cells from a first location to a second location within the memory, the contiguous subset having a size that is smaller than a total size of the memory, the controller to receive address information and to determine the size of the contiguous subset of data based on the address information.
wherein data stored in the memory outside of the contiguous subset is not shifted when the contiguous subset is shifted.

2. A shiftable memory comprising:
a memory having built-in shifting capability to shift a contiguous subset of data stored by the memory from a first location to a second location within the memory, the contiguous subset having a size that is smaller than a total size of the memory, wherein data stored in the memory outside of the contiguous subset is not shifted when the contiguous subset is shifted,
wherein the memory having built-in shifting capability comprises:
a shift register having a plurality of memory cells to store data including the contiguous subset; and
a controller to select the contiguous subset of data stored by the shift register and to direct the shift register to shift the selected contiguous subset from the first location to the second location within the shift register, the selected contiguous subset having a length that is less than a total length of the shift register,
wherein the shift occurs entirely within the shift register, and wherein each memory cell of the shift register comprises a plurality of memory locations to store data bits corresponding to a data word, a plurality of the data bits defining a width of the shift register.

3. The shiftable memory of claim 1, wherein the second location within the memory is located either above or below the first location.

4. A shiftable memory comprising:
a memory having built-in shifting capability to shift a contiguous subset of data stored by the memory from a first location to a second location within the memory, the contiguous subset having a size that is smaller than a total size of the memory, wherein data stored in the memory outside of the contiguous subset is not shifted when the contiguous subset is shifted,
wherein the memory having built-in shifting capability comprises:
a shift register having a plurality of memory cells to store data including the contiguous subset; and
a controller to select the contiguous subset of data stored by the shift register and to direct the shift register to shift the selected contiguous subset from the first location to the second location within the shift register, the selected contiguous subset having a length that is less than a total length of the shift register,
wherein the shift occurs entirely within the shift register, and wherein the controller comprises an augmented decoder to assert an output corresponding to each of the memory cells of the selected contiguous subset within the shift register.

5. The shiftable memory of claim 4, wherein the augmented decoder is to further assert an additional output corresponding to a memory cell adjacent to and one of immediately above the selected contiguous subset and immediately below the selected contiguous subset, the additional output corresponding to the memory cell immediately above the selected contiguous subset being asserted when the stored data is to be upshifted within the shift register, and the additional output corresponding to the memory cell immediately below the selected contiguous subset being asserted when the stored data is to be shifted down within the shift register.

6. The shiftable memory of claim 1, wherein each of the memory cells comprises a static random access memory (SRAM) cell and a logic circuit, the logic circuit to select among a plurality of inputs that are to be applied by the logic circuit to a data input of the SRAM cell of a particular memory cell of the shift register, the plurality of inputs comprising an external data input to be selected by the logic circuit when external data is to be written to and stored by the SRAM cell of the particular memory cell, an output of an adjacent SRAM cell immediately below the SRAM cell of the particular memory cell to be selected by the logic circuit when stored data is to be upshifted within the shift register, and an output of another adjacent SRAM cell immediately above the SRAM cell of the particular memory cell to be selected by the logic circuit when stored data is to be downshifted within the shift register.

7. The shiftable memory of claim 1, wherein each of the memory cells comprises a D flip-flop and a multiplexer, the multiplexer to select among one of four inputs to be applied to a data input of the D flip-flop, the four inputs corresponding to a data input to be selected by the multiplexer when external data is to be written to and stored by the D flip-flop, an output of an adjacent D flip-flop at an address mmediately above the D flip-flop to be selected by the multiplexer when stored data is to be downshifted within the shift register, an output of an adjacent D flip-flop at an address immediately below the D flip-flop to be selected by the multiplexer when stored data is to be upshifted within the shift register, and an output of the D flip-flop to be selected when stored data is to be held and not shifted by the D flip-flop.

8. A shiftable memory system comprising:
a plurality of memory cells arranged adjacent to one another in an array, a memory cell to store one or more data bits corresponding to a data word;
a controller to select and to shift a contiguous subset of data words within the array, the contiguous subset having a length that is less than a total length of the array, a shift representing either an upshift or a downshift of only the contiguous subset of data words within the array selected by the controller; and
a processor to provide an address and the length of the contiguous subset of data words.

9. The shiftable memory system of claim 8, wherein the controller comprises an augmented decoder to assert a load enable of each memory cell from a beginning to an end of the selected contiguous subset of data words, the beginning corresponding to the address and the end corresponding to a sum of the address and the length received from the processor, the augmented decoder to further assert a load enable corresponding to at least one of a memory cell immediately above the memory cell at the beginning and a memory cell immediately below the memory cell at the end of the contiguous subset depending on a direction of the shift within the array.

10. The shiftable memory system of claim 8, wherein the plurality of memory cells comprise static random access memory (SRAM) cells.

11. The shiftable memory system of claim 8, further comprising a logic circuit to select from among a plurality of inputs to be applied to a data input of a given memory cell, the plurality of inputs including a data input to be selected by the logic circuit when an external data word is to be written to and stored by the given memory cell, an output of an adjacent memory cell at an address immediately below the given memory cell to be selected by the logic circuit when a data word is to be upshifted within the array, and an output of an adjacent memory cell at an address immediately above the given memory cell to be selected by the logic circuit when a data word is shifted down within the array.

12. A method comprising:
selecting, by a memory, a contiguous subset of data stored in memory cells of the memory having built-in shifting capability, a size of the selected contiguous subset of data being less than a total size of the memory;
receiving, by the memory, address information;
determining, by the memory, the size of the selected contiguous subset of data based on the received address information;
shifting, by the memory, the selected contiguous subset of data from a first location to a second location within the memory,
wherein when the selected contiguous subset is shifted, the shifting occurs entirely within the memory and does not shift other stored data located outside of the selected contiguous subset.

13. The method of claim 12, wherein the address information comprises an address and a length, the address designating a memory cell within the memory corresponding to a beginning of the contiguous subset of data, and a sum of the address and the length designating a memory cell within the memory corresponding to an end of the contiguous subset of data.

14. The method of claim 12, further comprising one of writing data to the memory and reading data from the memory after shifting the selected contiguous subset of data.

15. The shiftable memory of claim 1, wherein the address information is selected from among:
a starting address and an ending address of the contiguous subset of data, or
an address and a length of the contiguous subset of data.

16. The shiftable memory of claim 1, wherein the address information is received from a processor that is external of the shiftable memory.

17. The shiftable memory system of claim 8, wherein the controller is to select the contiguous subset of data words based on the address and the length.

18. The shiftable memory system of claim 17, wherein the controller is to:
based on the address and the length, assert enable signals to selected memory cells of the plurality of memory cells, the selected memory cells storing the contiguous subset of data words, and
assert at least one further enable signal to at least one further memory cell of the plurality of memory cells, and cause shifting of a portion of the contiguous subset of data words to the at least one further memory cell.

19. The shiftable memory system of claim 8, comprising:
a memory device comprising the plurality of memory cells and the controller, wherein the processor is external of the memory device; and
a data bus interconnecting the processor and the memory device, the processor to read data from or write data to the memory device over the memory bus.

20. The method of claim 12, wherein the address information is received from a processor that is external of the memory.

* * * * *